United States Patent [19]
Barmore

[11] Patent Number: 6,016,352
[45] Date of Patent: Jan. 18, 2000

[54] LOW DISTORTION AUDIO MUTING CIRCUIT

[75] Inventor: Bradley Allen Barmore, Portland, Oreg.

[73] Assignee: Intel Corporation, Santa Clara, Calif.

[21] Appl. No.: 08/974,974

[22] Filed: Nov. 20, 1997

[51] Int. Cl.[7] .................................................. H04B 15/00
[52] U.S. Cl. ........................................ 381/94.5; 381/104
[58] Field of Search .................................. 381/94.5, 104, 381/109, 102; 455/200.1; 330/51

[56] References Cited

U.S. PATENT DOCUMENTS 4,390,847  6/1983  Yamada et al. ............................ 330/51
4,683,386  7/1987  Kamikawara ......................... 455/200.1

Primary Examiner—Ping Lee
Attorney, Agent, or Firm—Blakley, Sokoloff, Taylor & Zafman LLP

[57] ABSTRACT

A muting circuit is provided to mute an audio signal at an audio output. The muting circuit includes a switching device having an enable input and being adapted to be coupled between an audio output and ground, the switching device being on when the enable input is at a deenergized voltage level. A mute controller is coupled to receive a mute signal and provide a signal to the enable input of the switching device to bias the switching device on.

16 Claims, 4 Drawing Sheets

LOW DISTORTION AUDIO MUTING CIRCUIT

BACKGROUND OF THE INVENTION

1. Field of the Invention

This invention relates generally to audio systems, and, more particularly, to a low distortion audio muting circuit for an audio system.

2. Description of the Related Art

Today, audio systems typically come equipped with a muting circuit to disable the audio output when the signal is undesirable or unnecessary. The audio systems typically include audio amplifiers that amplify the input to drive a load such as a speaker. When muting is activated, the amplified audio signal is heavily attenuated with respect to the input signal.

It is desirable to have a muting circuit that not only functions effectively while an audio system is powered-on but also during the system's power on/off cycle. This is because, when a power source of an audio amplifier is turned on or off, a large pop noise is emitted from the speakers. This discordant noise is caused by a sudden surge of voltage during the power on/off cycle of the audio amplifier. Even though the pop occurs momentarily, it can cause damage to sensitive audio speakers.

One attempt that the prior art has made to fix the power on/off pop is to use an NPN bipolar junction transistor (referred to as NPN transistor hereinafter) to ground the audio output signal as the power supplies rise, thereby muting the signal. FIG. 1 illustrates a circuit 1 that mutes an output signal $V_{out}$ 25 of an audio amplifying circuit 2. As shown, the muting circuit 1 includes an NPN transistor 15, a mute controller $V_{cntl}$ 20, and a resistor 50, while the audio amplifying circuit 2 includes an operational amplifier 10, an input source $V_{in}$ 5, a capacitor 55, and resistors 35, 40, 45.

The input source $V_{in}$ 5 is connected between a ground node 30 and a first terminal of the input resistor 35. The second terminal of the input resistor 35 is coupled to the non-inverting input of the operational amplifier 10. The output of the operational amplifier 10 is coupled to a first terminal of the capacitor 55 and a first terminal of resistor 45. A second terminal of the capacitor 55 is connected to the collector terminal of the NPN transistor 15. A second terminal of the resistor 45 is coupled to the inverting input of the operational amplifier 10 and a first terminal of the second feedback resistor 40. A second terminal of the second feedback resistor 40, the second terminal of the mute controller $V_{cntl}$ 20, and an emitter terminal of the NPN transistor 15 are coupled to the ground node 30. The resistor 50 is coupled between a first terminal of the mute controller $V_{cntl}$ 20 and a base terminal of the NPN transistor 15.

While the muting circuit 1 of FIG. 1 is generally able to ground the audio output signal $V_{out}$ 25, it still suffers from several shortcomings: it only marginally mutes the power on/off audio pop; it inadequately mutes the audio output signal $V_{out}$ 25; it introduces distortion; and, it is not suitable for muting multiple audio output signals $V_{out}$ 25.

The muting circuit 1 is only marginally capable of muting the power on/off pop because the NPN transistor 15 must first be turned on before it can conduct current to the ground, thereby shorting the output to ground and clamping (i.e., muting) the audio output signal $V_{out}$ 25. To turn on the NPN transistor 15, the mute controller $V_{cntl}$ 20 must supply at least one to two volts. But because the mute controller $V_{cntl}$ 20 is unable to provide the necessary voltage until the power supply (not shown) reaches at least one to two volts, the NPN transistor 15 remains off. Thus, the NPN transistor 15 is unable to ground the output signal $V_{out}$ 25 and prevent the audio pop, until it is turned on.

The muting circuit 1 of FIG. 1 is unable to adequately mute the audio output signal $V_{out}$ 25 because the NPN transistor 15 cannot properly clamp the negative cycle of the audio output signal $V_{out}$ 25. FIG. 2 shows the input signal generated by the input source $V_{in}$ 5 and the resulting audio output signal $V_{out}$ 25 while the NPN transistor 15 is on. As illustrated, the audio output $V_{out}$ signal 25 is muted during the positive cycles, but not the negative cycles. The inability of the NPN transistor 15 to properly clamp the negative cycles of the audio output signal $V_{out}$ 25 results in unwanted noise, which can be audible through the speakers.

In addition to the inadequacies of properly muting the audio output signal $V_{out}$ 25, the prior art muting circuit 1 distorts the negative half of the audio output signal $V_{out}$ 25, even when deactivated (i.e., unmuted). During the negative cycle of the audio output signal $V_{out}$ 25, the NPN transistor 15 becomes forward biased across its collector-base junction because the voltage at the collector terminal falls below the voltage at the base terminal of the NPN transistor 15. When the NPN transistor 15 becomes forward biased across its collector-base junction, the current flows from the base to the collector terminal and into the output terminal of the operational amplifier 10, as well as to the load (not shown). The additional current flow into the output of the operational amplifier 10 and into the load distorts the audio output signal $V_{out}$ 25 by up to ten percent. Generally, a distortion of approximately 0.1 percent can be audible.

Another drawback of the muting circuit 1 is that it is not suitable for muting a large number of audio output signals $V_{out}$ 25. This limitation is best understood with reference to FIG. 3, which depicts the mute circuit 1 of FIG. 1, adapted for muting multiple audio output signals $V_{out}$ 25, 245. In addition, FIG. 3 also shows a schematic diagram of the mute controller $V_{cntl}$ 20, which includes a muting control input 200, an open collector buffer 205, a resistor 210 coupled between an output of the open collector buffer 205 and a twelve volt voltage source (not shown).

The mute controller $V_{cntl}$ 20 controls the NPN transistor 15 of the muting circuit 1. The NPN transistor 15 remains off during periods in which essentially no voltage is applied to the muting control input 200, and turns on when a voltage of approximately five volts is applied to the muting control input 200. When the NPN transistor 15 is on, it mutes the audio output signal $V_{out}$ 25 by grounding it.

The mute controller $V_{cntl}$ 20 is capable of muting multiple audio output signals $V_{out}$ 25 as well. As shown in FIG. 3, first terminals of the resistors 50, 230 are coupled to the output node 250 of the mute controller $V_{cntl}$ 20. Second terminals of the resistors 50, 230 are coupled to base terminals of the NPN transistors 15, 240, respectively. The audio output signals $V_{out}$ 25, 245 are coupled to the collector terminals of the respective NPN transistors 15, 240, which, when activated, ground the audio output signals $V_{out}$ 25, 245. As illustrated in FIG. 3, it is possible to mute additional audio output signals by utilizing additional NPN transistors for each audio output.

In systems having multiple audio outputs, it is often desirable to have the ability to quickly mute all of the audio output signals. One way to quickly mute multiple audio output signals $V_{out}$ 25, 245 is to utilize only one mute controller $V_{cntl}$ 20 to drive the multiple NPN transistors 15, 240 to ground the audio output signals $V_{out}$ 25, 245. When the NPN transistors 15, 240 are on (i.e., during the mute mode), they draw current from the mute controller $V_{cntl}$ 20, which is capable of providing only enough current to reliably turn on about two NPN transistors 15, 240. Thus, when additional NPN transistors are utilized to mute additional audio output signals, the mute controller $V_{cntl}$ 20 is unable to fully turn on all of the NPN transistors because of the excessive load. While it is possible to increase the drive capability of the mute controller $V_{cntl}$ 20 by decreasing the value of the resistor 210, it can be done only to a limited extent due to the increased power dissipation and the inability of the open collector buffer 205 to sink the increased drive capability when unmuted. Another method of increasing the drive capability is to utilize additional mute controllers $V_{cntl}$ 20 to drive the NPN transistors. But this would require more board space, result in higher power dissipation, and make it difficult to mute all audio output signals quickly.

The present invention is directed to overcoming, or at least reducing the effects of, one or more of the problems set forth above.

SUMMARY OF THE INVENTION

In one aspect of the present invention, a muting circuit includes a switching device having an enable input and being adapted to be coupled between an audio output and a ground, the switching device being "on" when the enable input is at a deenergized voltage level. A mute controller is coupled to receive a mute signal and provide a signal to the enable input of the switching device to bias the switching device on.

In another aspect of the present invention, a method is provided for controlling an audio signal present at an output terminal. The method includes activating a switching device having an enable input, the switching device being adapted to ground the output terminal and mute the audio signal when the enable input is at a deenergized voltage level.

BRIEF DESCRIPTION OF THE DRAWINGS

Other objects and advantages of the invention will become apparent upon reading the following detailed description and upon reference to the drawings in which.

Figure 1:
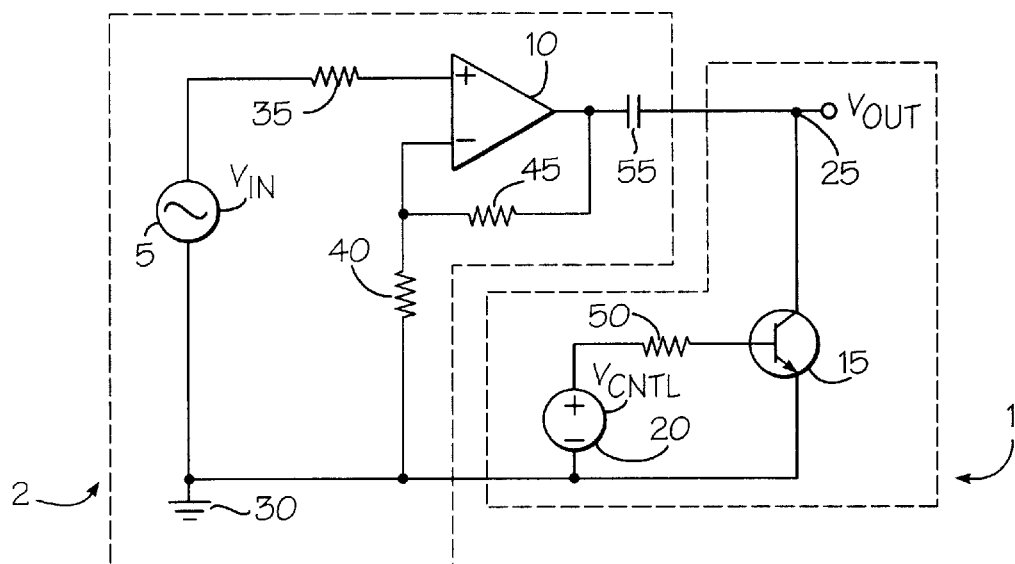
FIG. 1 is a schematic diagram of a prior art muting circuit.
Figure 2:
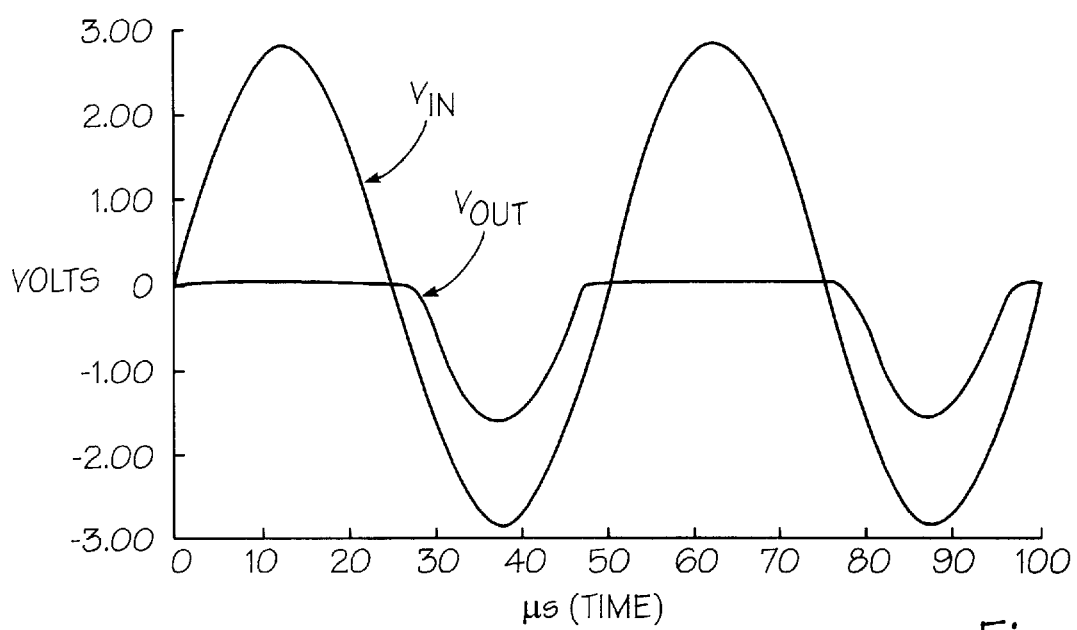
FIG. 2 is a stylized representation of an input and output waveform of the muting circuit of FIG. 1.
Figure 3:
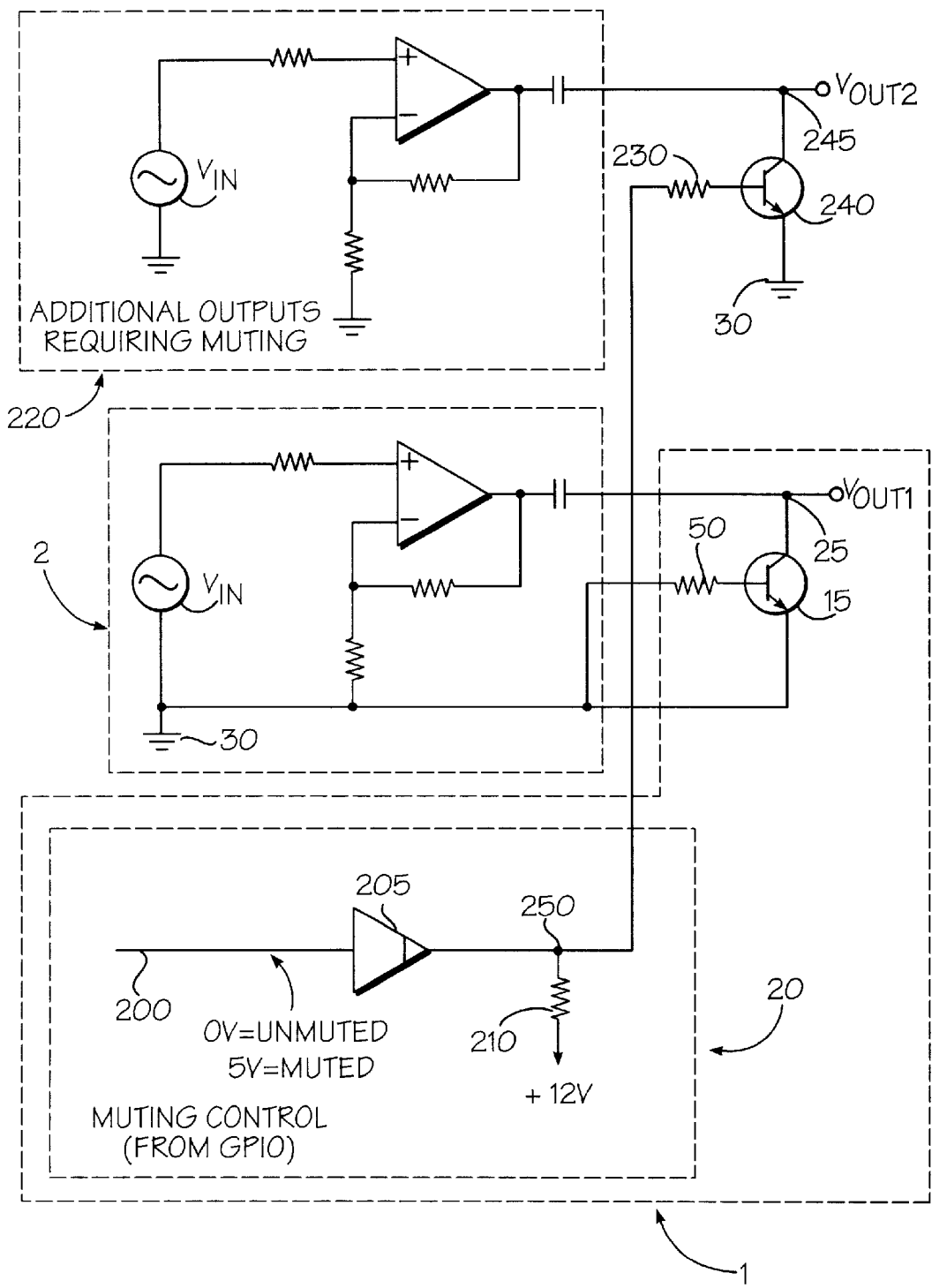
FIG. 3 is a schematic diagram of the muting circuit of FIG. 1 adapted for muting multiple audio output signals.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

Detailed Description of Specific Embodiments

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 4:
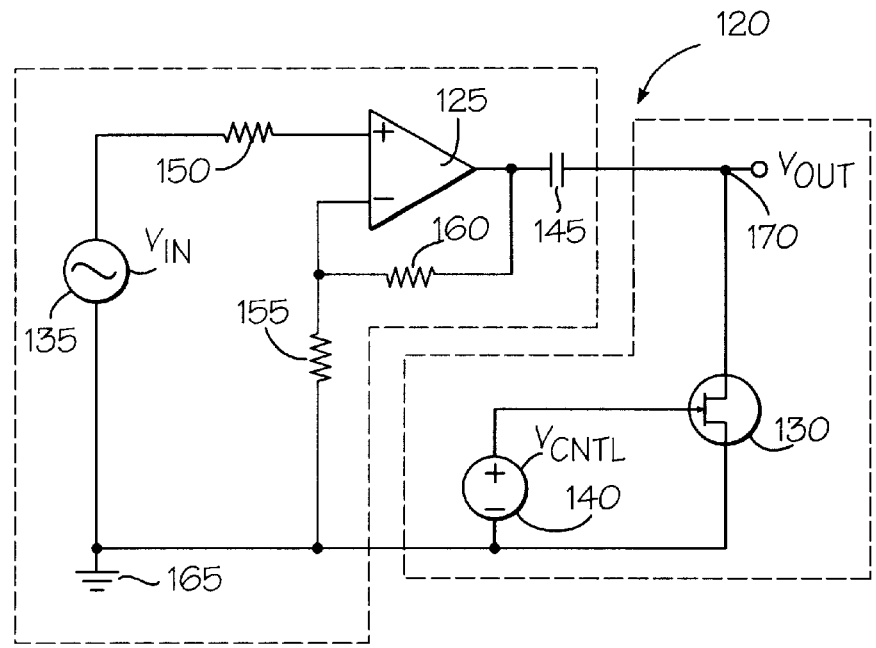
FIG. 4 a schematic diagram of the muting circuit in accordance with the present invention.

With reference now to the drawings, and in particular to FIG. 4, there is shown a schematic diagram of a muting circuit 120 in accordance with the present invention. As shown, the circuit 120 includes an operation amplifier 125, a junction field effect transistor (JFET) 130, an input source $V_{in}$ 135, a mute controller $V_{cntl}$ 140, a capacitor 145, and resistors 150, 155, 160.

The input source $V_{in}$ 135 is connected between a ground node 165 and a first terminal of the input resistor 150. A second terminal of the input resistor 150 is coupled to a non-inverting input of the operational amplifier 125. The output of the operational amplifier 125 is coupled to a first terminal of the capacitor 145 and a first terminal of the first feedback resistor 160. A second terminal of the capacitor 145 is connected to the drain terminal of the JFET 130. A second terminal of the first feedback resistor 160 is coupled to an inverting input of the operational amplifier 125 and a first terminal of the second feedback resistor 155. A second terminal of the second feedback resistor 155, a second terminal of the mute controller $V_{cntl}$ 140, and the source terminal of the JFET 130 are coupled to the ground node 165. A gate terminal of the JFET 130 is coupled to a first terminal of the mute controller $V_{cntl}$ 140.

The present invention overcomes the shortcomings of the prior art muting circuit 1 (see FIG. 1) by using the N-channel JFET 130 to mute the audio output signal $V_{out}$ 170. The present invention eliminates the undesirable power on/off pops, successfully mutes the negative half cycle of the audio output signal $V_{out}$ 170, does not introduce distortion during the negative half of the amplified audio waveform, and is adaptable for adequately muting a plurality of audio output signals $V_{out}$ 170.

The JFET 130 is able to eliminate the power on/off pops because of its ability to conduct when no power is applied to an enable input of the JFET 130. Because the JFET 130 is capable of conducting current when a deenergized (i.e., substantially zero) signal is applied to its enable input, it is able to short the voltage spikes caused during the power on/off cycle. So, as the power supply (not shown) begins to rise, any current in or out of the operational amplifier 125 is conducted directly to ground 165 through the JFET 130, thereby preventing a voltage rise in the audio output signal $V_{out}$ 170 and the undesirable audible pop. Furthermore, it is possible to ensure that no audible pops occur throughout the entire power on/off cycle by properly biasing (described in more detail below) the gate terminal of the JFET 130.

Figure 5:
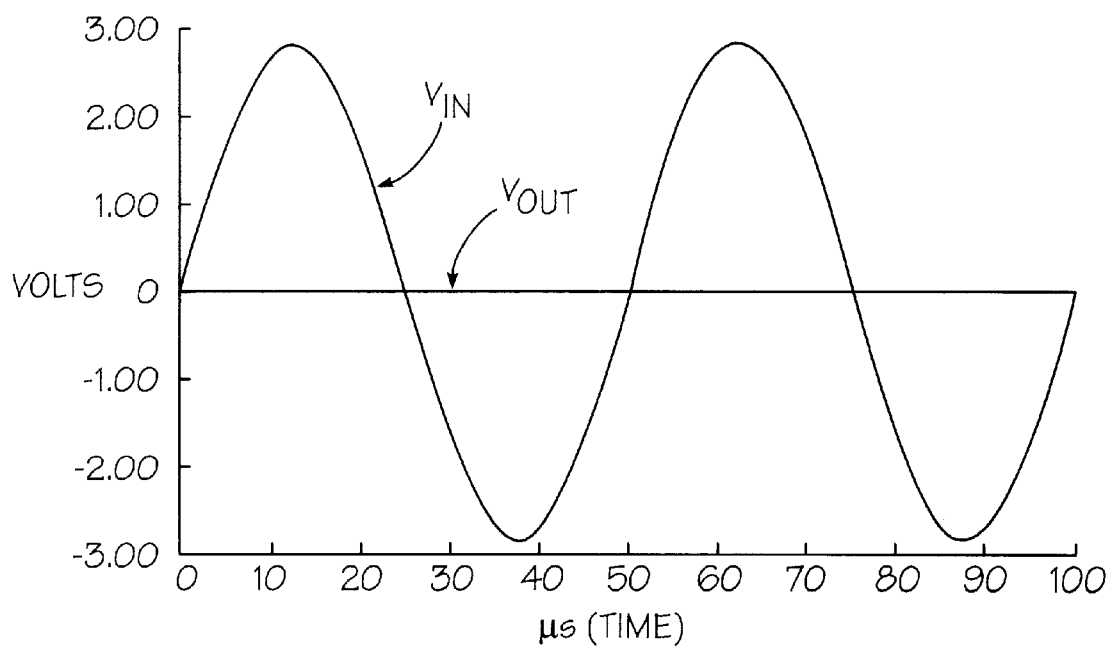
FIG. 5 is a stylized representation of an input and output waveform of the muting circuit of FIG. 4.

As can be seen in FIG. 5, the present invention is capable of muting the positive as well as the negative cycles of the audio output. This is because the JFET 130 can conduct current in both directions, from the drain terminal to the source terminal, and vice versa. Thus, the muting level is strictly dependent upon the direct current (DC) resistance of the device, which can be reduced to small values by connecting multiple JFETs 130 in parallel.

The present invention does not introduce substantial amounts of distortion. There is substantially no distortion because the JFET 130 is a symmetrical device and because it has extremely low leakage current from its drain terminal to its source terminal. Furthermore, the JFET 130 can tolerate relatively large voltage swings on its drain terminal before it causes a noticeable distortion.

Figure 6:
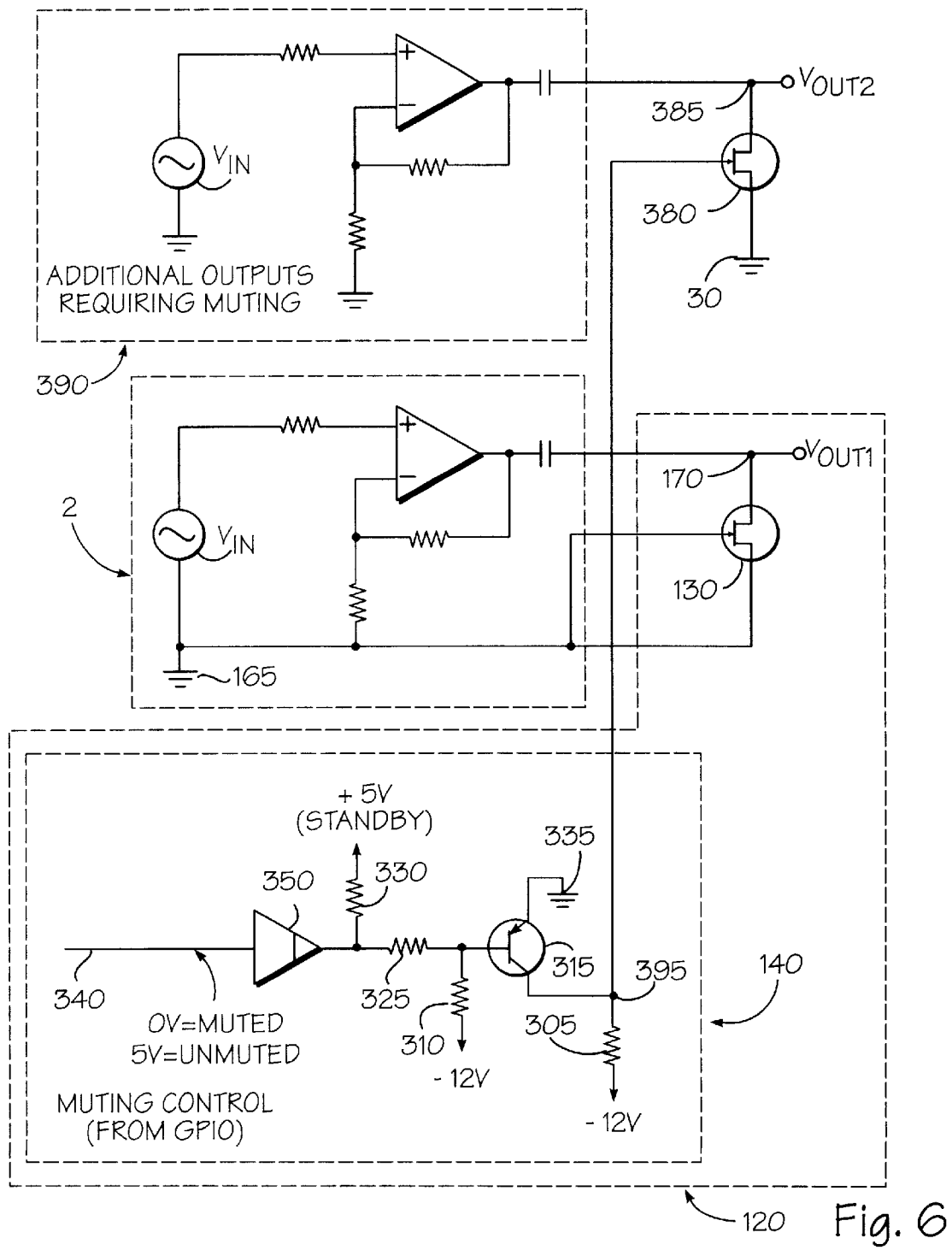
FIG. 6 is a schematic diagram of the muting circuit of FIG. 4 adapted for muting multiple audio output signals.

The mute controller $V_{cntl}$ 140, is capable of muting a plurality of audio output signals $V_{out}$ 170, 385, as illustrated in FIG. 6. As shown, JFETs 130, 380, which are driven by the common mute controller $V_{cntl}$ 140, are utilized to ground the audio output signals 170, 385. Specifically, the gate terminals of the JFETs 130, 380 are coupled to an output node 395 of the mute controller $V_{cntl}$ 140, the drain terminals of the JFETs 130, 380 are coupled to the audio output signals 170, 385, and the source terminals of the JFETs 130, 380 are coupled to the ground node 165. Similarly, additional audio output signals (not shown) can be muted using additional JFETs (not shown) coupled to the output node 395 of the mute controller $V_{cntl}$ 140. Because the JFETs 130, 380 require a low gate current to operate, the mute controller $V_{cntl}$ 140 is capable of driving up to 3000 JFETs. This means that essentially 3000 audio output signals $V_{out}$ 170, 385 can be quickly muted using only one mute controller $V_{cntl}$ 140. The ability to quickly mute a plurality of audio output signals is particularly helpful in personal computer systems having a plurality of audio channels, wherein the software applications running on such personal computer systems can mute all of the audio output signals by toggling a single, general purpose input and output (GPIO) bit, rather than toggling the bits for individual audio output signals.

FIG. 6 also shows a detailed schematic diagram of the mute controller $V_{cntl}$ 140, which includes a muting control input 340, an open collector buffer 350, a PNP transistor 315, and resistors 305, 310, 325, 330. An emitter terminal of the PNP transistor 315 is coupled to a ground node 335. A first terminal of the resistor 305 is coupled to a negative twelve volt source (not shown), and a second terminal of the resistor 305 is coupled to a collector terminal of the PNP transistor 315. A first terminal of the resistor 310 is also coupled to a negative twelve volt source (not shown), while a second terminal is coupled to a first terminal of the resistor 325 and a base terminal of the PNP transistor 315. A second terminal of the resistor 325 is coupled to an output terminal of the open collector buffer 350 and a first terminal of the resistor 330. A second terminal of the resistor 330 is coupled to a five volt standby power supply (not shown), which supplies power even when the main power source (not shown) is switched off.

The mute controller $V_{cntl}$ 140 controls the JFET 130 of the muting circuit 120. The JFET 130 remains on during periods in which essentially zero voltage is applied to the muting control input 340, and turns off when a voltage of approximately five volts is applied to the muting control input 340. The JFET 130 grounds the audio output signal $V_{out}$ 170 while it is on. The five volt standby power supply (not shown) ensures that the JFET 130 remains on during the entire power on/off cycle, thereby preventing the audio pops from occurring.

Providing essentially a zero volt signal to the muting control input 340 causes the open collector buffer 350 to sink current, pulling the base of the transistor 315 to a voltage level less than ground, which biases the transistor 315 "on." When the transistor 315 is "on," the collector terminal of the transistor 315 grounds the output node 395 of the mute controller $V_{cntl}$ 140, thereby activating the JFETs 130, 380.

Applying essentially a five volt signal to the muting control input 340 causes the voltage at the base terminal of the transistor 315 to approach zero volts, which biases the transistor 315 "off." With the transistor 315 "off," the voltage at the output node 395 of the mute controller $V_{cntl}$ 140 reaches essentially negative twelve volts, thereby deactivating the JFETs 130, 380.

The circuitry of the embodiment disclosed in FIG. 4 has been implemented using a n-channel JFET 130. However, it is envisioned that switching devices or other types of transistors such as a metal-oxide-semiconductor field-effect transistor (MOSFET) or a p-channel JFET, for example, can be utilized without departing from the spirit and scope of the present invention.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A muting circuit comprising:
   a switching device having an enable input and being adapted to be coupled between an audio output and ground, the switching device being on when the enable input is at a deenergized voltage level; and
   a mute controller coupled to receive a mute signal and provide a signal to the enable input of the switching device to bias the switching device on, the mute controller including:
      an open collector buffer having an input and output, the input being coupled to receive the mute signal,
      a transistor having an enable input, the transistor coupled between ground and the enable input of the switching device,
      a first resistor coupled between a first voltage source and the enable input of the switching device,
      a second resistor coupled between the output of the open collector buffer and the enable input of the transistor,
      a third resistor coupled between the enable input of the transistor and a second voltage source, and
      a fourth resistor coupled between the output of the open collector buffer and a third voltage source.

2. The muting circuit of claim 1, wherein the first and second voltage sources provide substantially negative twelve volts.

3. The muting circuit of claim 1, wherein the third voltage source provides substantially five volts.

4. The muting circuit of claim 3, wherein the third voltage source is a standby voltage source.

5. The muting circuit of claim 1, wherein the switching device comprises a junction field effect transistor (JFET).

6. The muting circuit of claim 5, wherein the JFET comprises an n-channel JFET.

7. The muting circuit of claim 5, wherein the JFET comprises a p-channel JFET.

8. The muting circuit of claim 1, wherein the switching device comprises a metal-oxide-semiconductor field-effect transistor (MOSFET).

9. A muting circuit for an audio system having a plurality of audio outputs, comprising:
   a plurality of switching devices, each of the plurality of switching devices having an enable input and being adapted to be coupled between an audio output of the plurality of audio outputs and ground, each of the plurality of switching devices being on when the enable input is at a deenergized voltage level; and a mute controller coupled to receive a mute signal and provide a signal to the enable inputs of the plurality of switching devices to bias each of the plurality of switching devices on, the mute controller including:

an open collector buffer having an input and output, the input being coupled to receive the mute signal, a transistors having an enable input, the transistor coupled between ground and the enable inputs of the plurality of switching devices, a first resistor coupled between a first voltage source and the enable inputs of the plurality of switching devices, a second resistor coupled between the output of the open collector buffer and the enable input of the transistor, a third resistor coupled between the enable input of the transistor and a second voltage source, and a fourth resistor coupled between the output of the open collector buffer and a third voltage source.

10. The muting circuit of claim 9, wherein the first and second voltage sources provide substantially negative twelve volts.

11. The muting circuit of claim 9, wherein the third voltage source provides substantially five volts.

12. The muting circuit of claim 11, wherein the third voltage source is a standby voltage source.

13. The muting circuit of claim 9, wherein one or more of the plurality of switching devices comprise a junction field effect transistor (JFET).

14. The muting circuit of claim 13, wherein the JFET comprises an n-channel JFET.

15. The muting circuit of claim 13, wherein the JFET comprises a p-channel JFET.

16. The muting circuit of claim 9, wherein one or more of the plurality of switching devices comprises a metal-oxide-semiconductor field-effect transistor (MOSFET).

* * * * *